May 30, 1967 T. G. WEST 3,323,014

CIRCUITS FOR FIRING A PLURALITY OF SOLID STATE CONTROL DEVICES

Filed Dec. 17, 1962 5 Sheets-Sheet 1

INVENTOR.
Thomas G. West,
BY
Henry J. Marcinik
Attorney.

INVENTOR.
Thomas G. West,
BY Henry J. Mancinelli
Attorney.

INVENTOR.
Thomas G. West,
BY Henry J. Marcinick
Attorney.

INVENTOR.
Thomas G. West,
BY Henry J. Marciniak
Attorney.

INVENTOR.
Thomas G. West,
BY Henry J. Moscinski
Attorney.

United States Patent Office 3,323,014

Patented May 30, 1967

3,323,014
CIRCUITS FOR FIRING A PLURALITY OF SOLID STATE CONTROL DEVICES

Thomas G. West, Danville, Ill., assignor to General Electric Company, a corporation of New York Filed Dec. 17, 1962, Ser. No. 245,209
13 Claims. (Cl. 315—194)

This invention relates to circuits for firing a plurality of solid state devices, and more particularly to such circuits for symmetrically firing a plurality of solid state control devices.

In many applications, it is desirable, if not necessary, to fire a number of solid state control devices symmetrically, i.e. at the same phase angle, in order to control relatively large amounts of power. For example, where a load that requires more power than can be handled by a single solid state control device, is to be operated at various power levels, there is a need for a circuit that is capable of symmetrically firing a plurality of the control devices.

Solid state control devices may be used to vary the average power supplied to the large groups of fluorescent lamps and thereby operate the lamps at various illumination or dimming levels by controlling the interval of current conduction to the lamps in each half cycle or alternate half cycle of the power supply. The number of fluorescent lamps that can be operated from control circuits of this type depends upon the volt-ampere rating of the solid state devices. If the banks of lamps are to be uniformly dimmed, it is necessary to symmetrically fire the solid state devices in the system.

In some applications, it may be necessary to operate solid state control devices, such as silicon controlled rectifiers or other types of multilayer diodes, in series rather than in parallel because of the inherent voltage limitations of solid state devices. Even in applications where the voltage requirements are not severe, it may be more economical to operate two or more silicon controlled rectifiers in series rather than one high power device in order to utilize devices having a lower volt-ampere rating since the cost of a silicon controlled rectifier increases appreciably as the volt-ampere requirements increase.

In the past, where a number of solid state control devices, such as silicon controlled rectifiers or other multilayer diodes, were employed to control power to a load, each device had associated with it an individual firing circuit. The solid state device was fired at a selected point in each half cycle by its associated firing circuit. If a unijunction firing circuit was used, the firing point was usually adjusted by a potentiometer which controlled the charging rate of a capacitor. When the capacitor was charged to the peak point voltage of the unijunction transistor, the transistor was fired to provide a firing pulse at the gate of the control device. For symmetrical operation of a number of control devices, it was necessary to mechanically gang the potentiometers on a common shaft or if separate potentiometers were used, it was necessary to provide some means to drive all the potentiometers. It is desirable, therefore, to provide a firing circuit that is capable of supplying firing signals to a plurality of solid state devices without need for potentiometers in each firing circuit associated with the control devices and that is relatively simple and economical to manufacture and operate.

Accordingly, it is a general object of my invention to provide an improved firing circuit for controlling a plurality of solid state control devices.

Another object of the invention is to provide an improved firing circuit for supplying firing signals to a plurality of solid state controlled rectifiers for symmetrically firing the solid state control devices.

It is another object of the invention to provide an improved firing circuit wherein a relatively small potentiometer can be employed to control the operation of a plurality of solid state control devices.

A further object of the invention is to provide an improved firing circuit for use in dimming a plurality of fluorescent lamps that can be economically fabricated and that will readily control the average power supplied thereto.

In accordance with one form of my invention, I have provided an improved arrangement for firing a plurality of solid state control devices, such as silicon controlled rectifiers or multilayer diodes, wherein a master control device is used to fire the other or the slave control devices, as they will be hereinafter referred to. Each of the control devices is comprised of a plurality of semiconducting zones forming more than two P-N junctions. The master control device is coupled with a firing circuit and is fired at selected intervals.

Each of the slave control devices is associated with a serially connected capacitor and impedance element which are connected across a source of potential. Each of the capacitors is connected in parallel circuit relation with the master control device so that when the master control device is triggered into conduction, the capacitors are discharged. Each capacitor is coupled with one of the slave control devices so that a firing signal is applied to trigger the device when the capacitor is discharged. Thus, the slave control devices are symmetrically fired when the capacitors are discharged by the master control device.

The subject matter which I regard as my invention is set forth in the appended claims. The invention itself, however, together with further objects and advantages thereof may be understood by referring to the following description taken in conjunction with the accompanying drawings in which:

Figure 1:
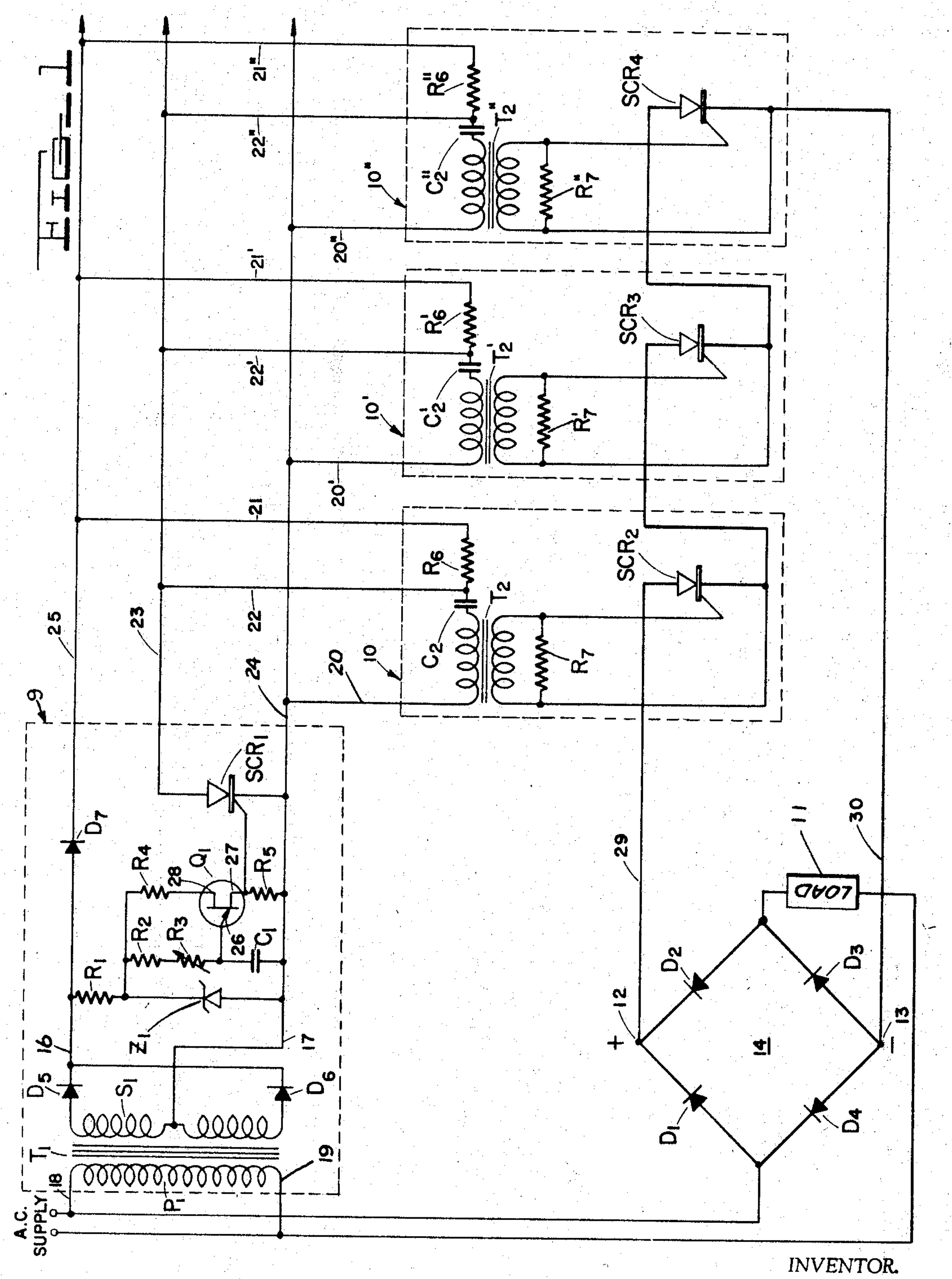
FIGURE 1 is a schematic circuit diagram of one form of my invention in which the improved firing circuit arrangement is used to fire a plurality of solid state control devices connected in series.

Referring now more particularly to FIGURE 1, the firing circuit arrangement is comprised of a master firing circuit 9, which includes a solid state control device $SCR_1$ and its associated firing circuit employing a unijunction transistor $Q_1$, and a plurality of auxiliary circuits 10, 10' and 10''. The auxiliary circuits 10, 10' and 10'' are coupled with the gates of a group of slave solid state control devices $SCR_2$, $SCR_3$ and $SCR_4$ that are symmetrically fired in each half cycle when the master control device $SCR_1$ is triggered into conduction by its associated firing circuit.

It will be noted that the slave control devices $SCR_2$, $SCR_3$ and $SCR_4$ are connected in series circuit relation within a full wave bridge rectifier 14, which includes the four diodes $D_1$, $D_2$, $D_3$ and $D_4$, and terminals 12 and 13. During operation, the full wave unfiltered output of the bridge rectifier 14 in conjunction with the slave control devices $SCR_2$, $SCR_3$ and $SCR_4$ function as a bidirectional switch to control the conduction angle of the current supplied to the load 11 in each half cycle. Current is supplied to the load 11 only when all three of the control devices $SCR_2$, $SCR_3$ and $SCR_4$ are switched into conduction. Commutation of the control devices $SCR_2$, $SCR_3$ and $SCR_4$ is achieved by the current falling off to substantially zero value at the end of each half cycle.

Synchronization between the load circuit and the master firing circuit 9 is accomplished by energizing the firing circuit 9 and the bridge rectifier 14 from the same alternating supply, which may be a 120 volt, 60 cycle source. It will be seen that input leads 18 and 19 of the firing circuit 9 are adapted for connection to an alternating power source. In the illustrated exemplification of the invention, shown in FIGURE 1, the alternating current input was converted to a rectified D.C. signal by a full wave bridge rectifier comprised of a transformer $T_1$ having a primary $P_1$ connected across the alternating power source, a center tapped secondary winding $S_1$ and diodes $D_5$ and $D_6$.

The firing signal source for the master control device $SCR_1$ is essentially a relaxation oscillator, which is connected through a voltage dropping resistor $R_1$ across the leads 16, 17. It will be seen that the same rectified source that energizes the relaxation oscillator also energizes the auxiliary circuits 10, 10' and 10'' by the connections 20, 21, 20', 21' and 20'', 21'' to the leads 24 and 25 of the master firing circuit 9. The connections 20, 22 and 20', 22' and 20'', 22'' to leads 23 and 24 of the master firing circuit 9 place the capacitors $C_2$, $C_2'$ and $C_2''$ in parallel circuit relation with the master control device $SCR_1$. Diode $D_7$ is provided to prevent the voltage across the capacitor $C_2$, $C_2'$ and $C_2''$ from being reflected back into the master control circuit 9 and disrupting the synchronization of the circuit 9 with the alternating supply.

Referring now to the master firing circuit 9 in more detail, it will be seen that the circuit 9 includes a Zener diode $Z_1$, the unijunction transistor $Q_1$, a capacitor $C_1$, resistors $R_2$, $R_4$, $R_5$ and a variable resistor or potentiometer $R_3$. The Zener diode $Z_1$ is connected across the firing circuit 9 and limits the voltage applied across the resistor $R_2$, $R_3$ and capacitor $C_1$ to the reverse breakdown voltage of the Zener diode $Z_1$. Although a unijunction transistor $Q_1$ was used as a switching element in the master firing circuit 9, it will be appreciated that other switching elements, such as transistors and multilayer diodes like Shockley diodes, may also be used. The unijunction transistor used in the exemplification of the invention is more fully described in the U.S. Patent No. 2,769,926, granted to Lesk, and U.S. Patent No. 2,907,934, granted to Engle.

The unijunction transistor $Q_1$ is comprised of three terminals 26, 27 and 28, which are generally referred to as an emitter, base-one and base-two electrodes, respectively. Between the base-one and the base-two electrodes 27 and 28 the unijunction transistor $Q_1$ exhibits the characteristics of an ordinary resistance. As long as the voltage applied at the emitter electrode 26 is less than the emitter peak point voltage of the device, it is reversely biased, and substantially no current flows between the emitter electrode 26 and the base-one electrode 27.

In the master firing circuit 9, the capacitor $C_1$ is charged through the resistors $R_2$ and $R_3$. Resistor $R_4$ limits interbase current of the unijunction transistor $Q_1$ and resistor $R_5$ in parallel with the gate to cathode impedance of controlled rectifier $SCR_1$, controls the rate of the discharge of capacitor $C_1$. The rate at which the capacitor $C_1$ is charged to the peak emitter voltage of the unijunction transistor determines the point in a half cycle when the transistor $Q_1$ will fire. When unijunction transistor $Q_1$ is fired, capacitor $C_1$ discharges through resistor $R_5$, and a firing signal is applied at the gate of the control device $SCR_1$. When the unijunction transistor $Q_1$ is fired, the control device $SCR_1$ is triggered into conduction. Thus, at a selected point in each half cycle as determined by the setting on the potentiometer $R_3$, control device $SCR_1$ is triggered into conduction, and the control devices $SCR_2$, $SCR_3$ and $SCR_4$ and any other devices connected in the circuit with additional auxiliary circuits, are also triggered into conduction at the selected point in each half cycle.

Each of the auxiliary circuits 10, 10', 10'' includes an RC circuit which is connected across the direct current power source by means of the connections 20, 21, 20', 21' and 20'', 21'' to leads 24 and 25 of the master firing circuit 9. The RC circuits are comprised of the resistors $R_6$, $R_6'$, $R_6''$ and capacitors $C_2$, $C_2'$, $C_2''$. When the capacitors $C_2$, $C_2'$, $C_2''$ are discharged by the switching action of the master control device $SCR_1$, a firing pulse is induced in the secondary of the pulse transformers $T_2$, $T_2'$, $T_2''$. The resistors $R_7$, $R_7'$ and $R_7''$ are connected across the gate and cathode of the slave control devices to limit the gate voltage. It will be appreciated that, although I have shown only three auxiliary circuits in the illustrated exemplification of my invention, additional auxiliary circuits may be connected in circuit across the leads 23, 24, 25, the number of auxiliary circuits depending on the volt-ampere rating of the control device $SCR_1$.

The control devices $SCR_1$, $SCR_2$, $SCR_3$, and $SCR_4$ used in the illustrated embodiment of my invention were silicon controlled rectifiers. These solid state devices are essentially PNPN semiconductor devices formed of a plurality of semiconducting zones of P and N type material providing three P-N junctions. In the drawing, the anode of the silicon controlled rectifier is identified by the arrow symbol which represents a connection at the end zone of P-type material. The cathode is identified by the horizontal line which represents a connection at the end zone of N-type material. The gate is identified by a diagonal line extending from the cathode and represents a connection at an intermediate zone of P-type material.

It will be appreciated that the potential provided at leads 16 and 17 and leads 29 and 30 is normally insufficient to bias controlled rectifiers $SCR_1$, $SCR_2$, $SCR_3$ and $SCR_4$ into conduction. It is required that a firing signal be applied at the gates thereof to cause an intermediate junction of the controlled rectifiers to be biased in the forward direction and thereby cause the rectifier to be switched in a conducting state. In order to turn-off the controlled rectifier and thereby permit the gates of controlled rectifier to regain control, it is necessary that the anode voltage be reduced to zero or a reverse bias be applied across the end zone for a finite length of time. In the illustrated exemplification of my invention, turn-off of the controlled rectifiers $SCR_1$, $SCR_2$, $SCR_3$, $SCR_4$ is achieved by virtue of the fact that an unfiltered rectified output is applied across each of the controlled rectifiers, and thus the anode voltage reduces substantially to zero at the end of each half cycle.

In operation, the master firing circuit 9 is subjected to a full wave rectified voltage that is clipped by the Zener diode $Z_1$. In each half cycle of the cyclically varying rectified source, capacitor $C_1$ is charged through the resistors $R_2$ and $R_3$ until it reaches the emitter peak point voltage of the unijunction transistor $Q_1$. When this occurs, transistor $Q_1$ is rendered conducting causing the capacitor $C_1$ to discharge through the emitter and base-one electrodes 26 and 27 and the resistor $R_5$ to supply a gating pulse across the gate and cathode of the master controlled rectifier $SCR_1$. Also, at the start of an arbitrary half cycle, charging current is supplied to the capacitors $C_2$, $C_2'$ and $C_2''$ and the voltage across these capacitors builds up at a rate determined by the RC time constant of the auxiliary circuits 10, 10′, 10″. Accordingly, when the master controlled rectifier $SCR_1$ is turned on, capacitors $C_2$, $C_2'$ and $C_2''$ have been charged to a definite voltage level and are caused to discharge through the primaries of pulse transformers $T_2$, $T_2'$, $T_2''$.

The amplitude of the discharge pulse is determined by the amount of the charge on the capacitors $C_2$, $C_2'$ and $C_2''$ when the master controlled rectifier $SCR_1$ is switched on. Suitable values are chosen for the resistors $R_6$, $R_6'$, $R_6''$, the capacitors $C_2$, $C_2'$, $C_2''$ and the reactance of the transformers $T_2$, $T_2'$, $T_2''$ so that the controlled rectifiers $SCR_2$, $SCR_3$ and $SCR_4$ are not turned on by the charging action on the capaictors $C_2$, $C_2'$, $C_2''$. The average power supplied to the load 11 is controlled by delaying the point in each half cycle in which the slave controlled rectifiers $SCR_2$, $SCR_3$ and $SCR_4$ are symmetrically switched from a blocking to a conducting state.

It will be appreciated that in conventional firing circuit arrangements, individual switching devices such as unijunction transistors are used in conjunction with each of the controlled rectifiers symmetrically fired. An important advantage of the invention is that the need for such individual firing circuits is eliminated. It will be understood that in the auxiliary firing arrangement of the invention, the total number of RC circuits does not affect the charging time constants of the individual capacitors. For example, when two slave controlled rectifiers are symmetrically operated with two auxiliary circuits, an equivalent value of the charging time constant is the resistance of one of the resistors $R_6$ divided by 2, multiplied by twice the capacitance of the capacitor $C_2$. The number of auxiliary circuits used does not affect the value of the charging time constants of the individual capacitors in the auxiliary circuits. In other words, the pulse width and amplitude of the signal applied at the gates of the slave controlled rectifiers $SCR_2$, $SCR_3$ and $SCR_4$ are independent of the number of auxiliary circuits connected in the system.

Figure 2:
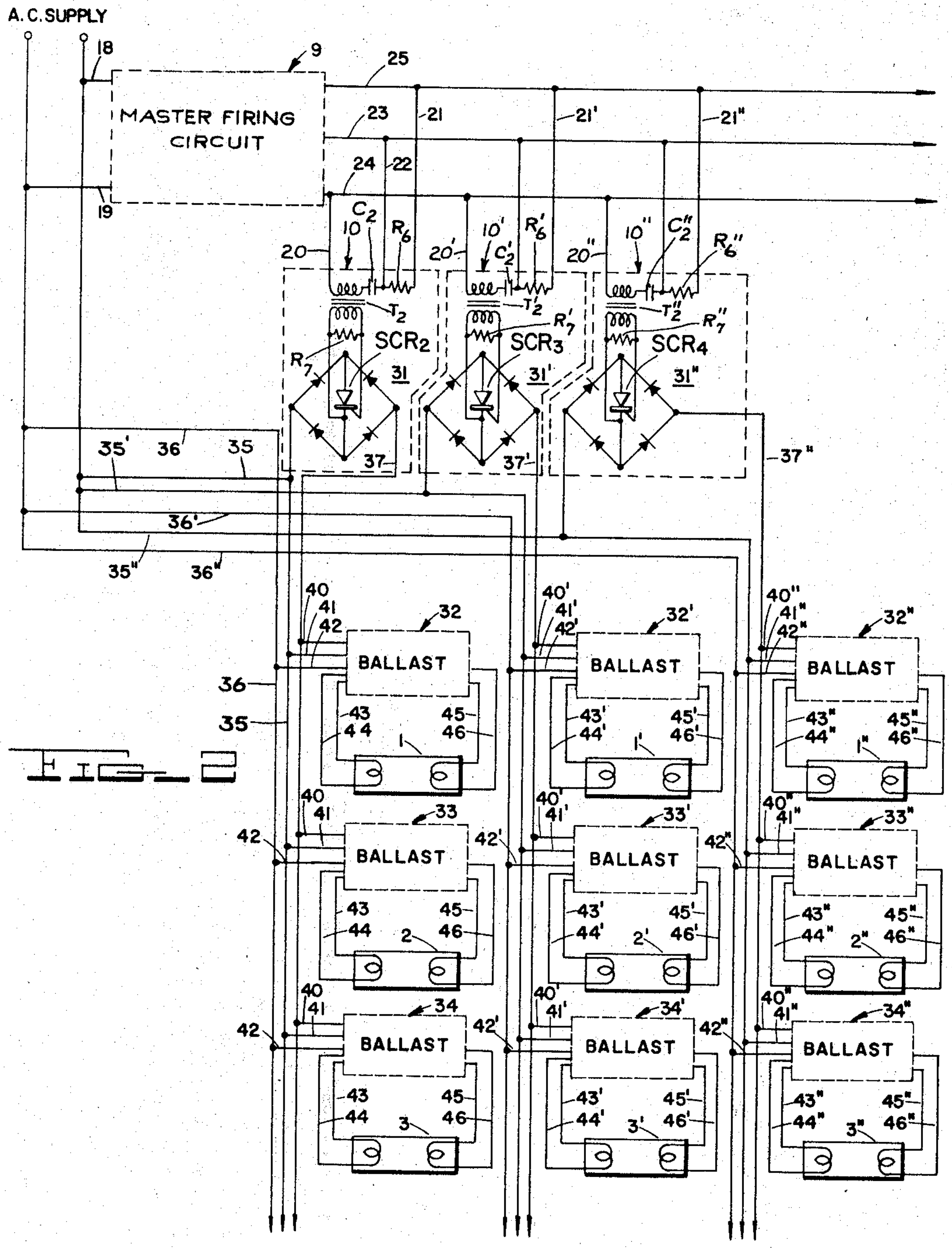
FIGURE 2 is a schematic circuit diagram of another form of my invention in which the solid state power devices are fired symmetrically in parallel to operate fluorescent lamps at selected levels of illumination.

Referring now to FIGURE 2, I have illustrated therein an application of the firing circuit shown in FIGURE 1 to a system for operating banks of fluorescent lamps. The master firing circuit 9 is shown in block diagram. The controlled rectifiers are operated within the bridge rectifiers 31, 31′ and 31″ as bidirectional switches to exercise control in each half cycle over the average power supplied to the ballasts 32, 33, 34, 32′, 33′, 34′ and 32″, 33″, 34″. The slave controlled rectifiers $SCR_2$, $SCR_3$ and $SCR_4$ with their respective ballasts control the illumination level of a plurality of lamps 1, 2, 3, 1′, 2′, 3′, and 1″, 2″, 3″.

Since the connections to the slave controlled rectifiers $SCR_2$, $SCR_3$ and $SCR_4$, the auxiliary circuits 10, 10′, 10″ and the master firing circuit 9 in FIGURE 2 are the same as in FIGURE 1, I have employed the same reference numerals to identify the corresponding connections and components. It will be noted that each of the three groups of ballasts are energized from an A.C. supply by the supply leads 35, 36, 35′, 36′ and 35″, 36″. The bridge rectifiers 31, 31′ and 31″ are connected across one of the supply leads 35, 35′ and 35″ and the switching leads 37, 37′ and 37″. When the slave controlled rectifiers $SCR_2$, $SCR_3$ and $SCR_4$ are switched into conduction, the switching leads 37, 37′, 37″ are joined in electrical circuit with supply leads 35, 35′ and 35″. As will be hereinafter more fully explained, when this connection is made, the primaries of the ballast transformers are connected in circuit with the secondaries, and current is supplied to all of the lamps.

The circuit shown in FIGURE 2 with the master firing circuit 9 as shown in FIGURE 1 were constructed to symmetrically fire a number of silicon controlled retifiers from a 120 volt, 60 cycle source. The following circuit components used are given by way of a specific exemplification of the invention and not by way of limitation thereof:

| | |
|---|---|
| Transformer $T_1$ | Primary winding 1246 turns of .0071 of an inch wire; secondary winding 1340 turns of .0071 of an inch wire. with tap at 670 turns. |
| Transformers $T_2$, $T_2'$, $T_2''$ | Primary winding 1220 turns of .0071 of an inch wire; secondary winding 260 turns of .0071 of an inch wire. |
| Diodes $D_1$, $D_2$, $D_3$, $D_4$ | 300 volt, 1.5 amperes (average). |
| Diodes $D_5$, $D_6$, $D_7$ | 150 volt, 300 milliamperers (average). |
| Zener diode $Z_1$ | 20 volts, 1 watt. |
| Resistor $R_1$ | 6,800 ohms, 1 watt. |
| Resistor $R_2$ | 2,700 ohms, ½ watt. |
| Potentiometer $R_3$ | 50,000 ohms (linear taper). |
| Resistor $R_4$ | 330 ohms, ½ watt. |
| Resistor $R_5$ | 47 ohms, ½ watt. |
| Resistors $R_6$, $R_6'$, $R_6''$ | 220 ohms, ½ watt. |
| Resistors $R_7$, $R_7'$, $R_7''$ | 150 ohms, ½ watt. |
| Silicon controlled rectifiers $SCR_1$, $SCR_2$, $SCR_3$, $SCR_4$ | 300 volt, 4.0 amperes (average). |
| Unijunction transistor $Q_1$ | G. E. 4JD5B24 |
| Capacitor $C_1$ | 0.25 microfarad. |
| Capacitor $C_2$ | 0.0068 microfarad. |

Figure 3:
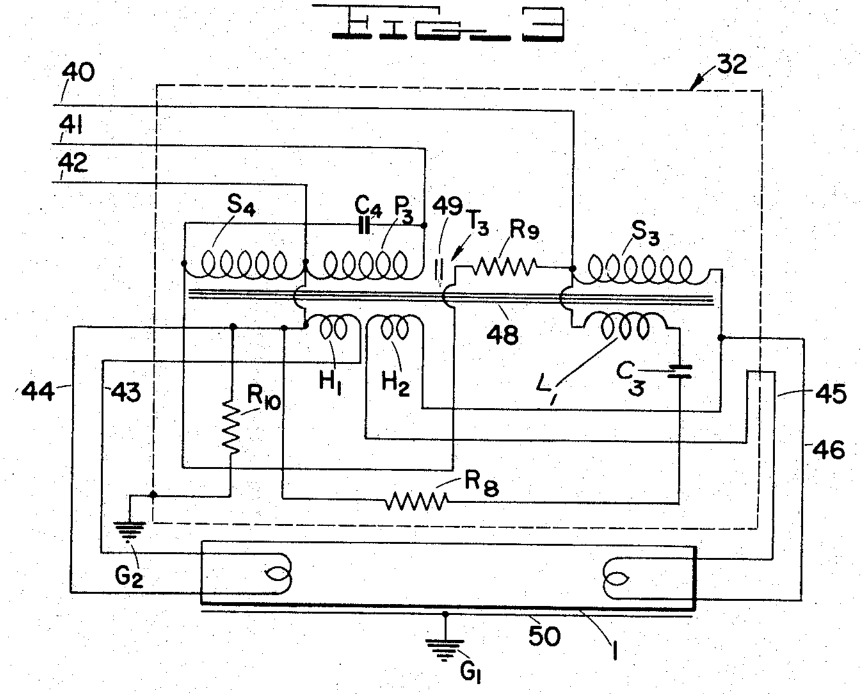
FIGURE 3 is a schematic circuit diagram of a ballast of the type that may be used in the lighting system shown in FIGURE 2.

A type of ballast which is particularly suitable for use in conjunction with the firing circuit arrangement of the invention is shown schematically in FIGURE 3. Ballasts of this type are more fully described and claimed in application Ser. No. 104,107, filed in the name of Luther L. Genuit, which issued Feb. 16, 1965 as Patent No. 3,170,-085, and in application Ser. No. 199,734, filed in the name of Theodore R. Harpley, which issued April 24, 1964, as Patent No. 3,130,347, both of these applications being assigned to the assignee of the present invention.

Referring to both FIGURES 2 and 3, it will be seen that the ballast 32 is connected in circuit with the switching lead 37 and the supply leads 35, 36 by the terminal leads 40, 41, 42. The external connections to fluroescent lamp 1 are made by leads 43, 44, 45 and 46. The external connections of all of the other ballasts are similarly made as indicated by the corresponding primed reference numerals.

Continuing now with the description of the ballast 32 shown in FIGURE 3, it will be seen that the ballast 32 is enclosed in a dashed rectangle which schematically represents a ballast case or other enclosure. The ballast 32 includes a ballast transformer $T_3$ comprised of a primary winding $P_3$ connected across the leads 41, 42, a high leakage reactance secondary winding $S_3$, a closely coupled secondary winding $S_4$, a pair of cathode heating windings $H_1$, $H_2$, a magnetic core 48 and magnetic shunts 49. The serially connected inductor $L_1$, coupled to the secondary winding $S_3$, capacitor $C_3$ and resistor $R_8$ are provided so that an oscillatory voltage is introduced into the lamp circuit to insure reignition of the lamp 1 in each cycle at low power levels. The capacitor $C_4$ serves to correct the power factor, and the resistor $R_9$ is provided so that the holding current level of the solid state device is maintained when the lamp 1 is operated at low dimming or power levels.

A grounded conductive plate 50, which usually is the lamp fixture, is positioned in proximity to lamp 1. It will be seen that the conductive plate 50 is connected to a ground $G_1$. Also, it will be noted a grounded resistor $R_{10}$ is connected to a ground $G_2$ through the ballast case and is used in conjunction with the conductive plate 50 to complete the auxiliary starting aid circuit. Such a grounding arrangement insures that in applications where the power distribution system is not effectively grounded, the voltage across the primary winding $P_3$ and the secondary winding $S_3$ is initially applied between a lamp electrode and the conductive plate 50 to cause ionization to be initiated in the vicinity of the electrode and thereby facilitate the starting of lamp 1.

The secondary winding $S_4$ is arranged so that voltage induced therein is out of phase with and substantially equal in magnitude to the voltage induced across the secondary winding $S_3$. Thus, as will be seen in the circuits shown in FIGURES 2 and 3, when the controlled rectifier $SCR_2$ is in a nonconducting or high impedance state, the voltage across the secondary winding $S_4$ effectively cancels out the voltage across the secondary winding $S_3$. During this interval no voltage is applied across lamp 1. When the controlled rectifier $SCR_2$ is in a conducting state, the voltages across the primary winding $P_3$ and the secondary winding $S_3$ are applied across lamp 1. Thus, during the conducting interval of the controlled rectifier $SCR_2$, the secondary winding $S_4$ and the holding current resistor $R_9$ insure that sufficient holding current flows through the controlled rectifiers $SCR_2$.

In its operation, the firing circuit shown in FIGURE 2 is substantially similar to the circuit shown in FIGURE 1 except the controlled rectifiers $SCR_2$, $SCR_3$ and $SCR_4$ are connected in parallel for operating a load which is comprised of fluorescent lamps. As in the apparatus of FIGURE 1, the slave controlled rectifiers $SCR_2$, $SCR_3$, $SCR_4$ are symmetrically fired in each half cycle, and the power supplied to the lamp load is controlled by the delaying of the point in each half cycle at which the controlled rectifiers $SCR_2$, $SCR_3$ and $SCR_4$ are triggered into conduction. The controlled rectifiers $SCR_2$, $SCR_3$ and $SCR_4$ and any other rectifiers connected in circuit are operated symmetrically in parallel to control the power supplied to the respective loads connected in circuit therewith.

Figure 4:
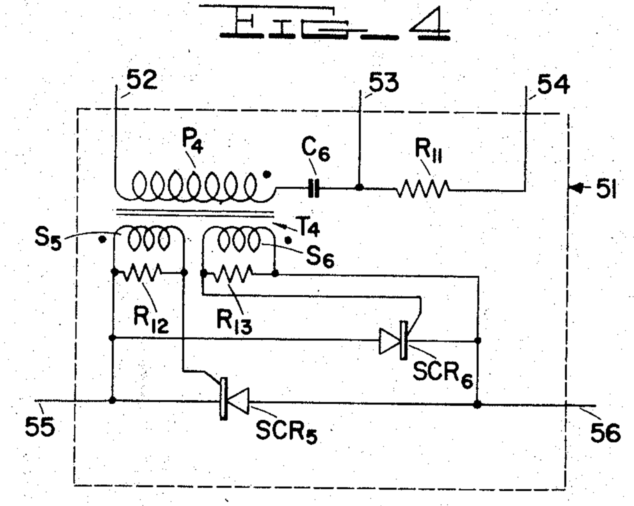
FIGURE 4 is a schematic circuit diagram of an auxiliary circuit which can be used in conjunction with the master firing control shown in FIGURE 1.

In FIGURE 4 I have illustrated auxiliary circuit 51 which is adapted for use in conjunction with the master firing circuit 9 shown in FIGURE 1. The leads 52, 53 and 54 are adapted for connection to leads 24, 23 and 25 respectively of the master firing circuit 9. The switching leads 55 and 56 are provided for connection to a load adapted to operate from an alternating source. The controlled rectifiers $SCR_5$ and $SCR_6$ function as a bidirectional switch.

The auxiliary circuit 51 is comprised of an RC circuit, which includes a resistor $R_{11}$, a capacitor $C_6$ connected in circuit with the primary winding $P_4$ of a transformer $T_4$ having a pair of secondary windings $S_5$ and $S_6$ inductively coupled with the primary winding $P_4$. When the solid state device of the master firing circuit is switched into conduction, the capacitor $C_6$ is discharged, and a firing pulse is induced across the secondary windings $S_5$ and $S_6$.

During operation, at the start of a half cycle the potential across the leads 52 and 54 causes the capacitor $C_6$ to be charged at a rate determined by the RC time constant for the circuit. When the solid state control device of the master firing circuit is switched into a conducting state, capacitor $C_6$ will be discharged to cause a pulse to be applied across the primary winding $P_4$ of transformer $T_4$. In the next half cycle when the polarity is reversed, controlled rectifier $SCR_6$ is fired by the pulse induced across the secondary winding $S_5$.

Figure 5:
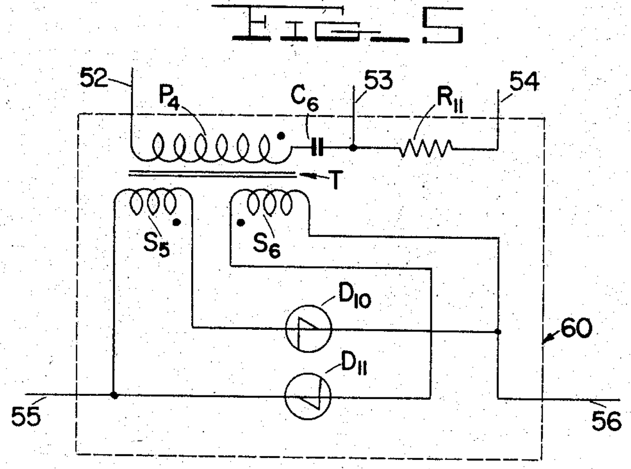
FIGURE 5 is a schematic diagram of an auxiliary circuit corresponding to the circuit shown in FIGURE 4 wherein four layer diodes are employed in conjunction with the improved firing circuit arrangement of the invention.

Referring now to FIGURE 5, I have shown therein an auxiliary circuit 60 which is essentially similar to the one shown in FIGURE 4 except that a pair of four layer diodes $D_{10}$ and $D_{11}$ are employed. Since the auxiliary circuit 60 functions essentially in the same manner as auxiliary circuit 51 shown in FIGURE 4, I have identified the corresponding parts of the two circuits with the same reference symbols.

It will be appreciated that the switching lead 55 is adapted for connection with one side of the alternating current power source that energizes the load, and would normally be designated as a black lead. When the charging capacitor $C_6$ is discharged by the switching action of the solid state device of the master firing circuit, across which leads 52 and 53 are adapted to be connected, a pulse is developed in the primary winding $P_4$. The pulse induced across the secondary windings $S_5$ and $S_6$ is sufficient in magnitude to switch the diode $D_{10}$ or $D_{11}$, which is forward biased at the time into a conducting state. It will be seen that the diode $D_{10}$ is forward biased when the switching lead 55 is positive with respect to switching lead 56. Conversely, when switching lead 55 is negative with respect to switching lead 56, diode $D_{11}$ is biased in a forward direction and will be fired at the instant in the half cycle when the pulse is induced across secondary winding $S_6$.

Figure 6:
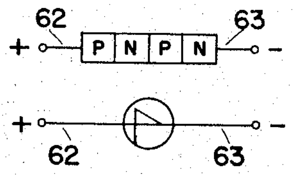
FIGURE 6 illustrates the P–N junction arrangement of the four layer diodes and the correspondence between the junction arrangement shown schematically and the schematic symbol used for the four layer diode in the illustrated exemplifications of the invention.

The four layer diodes, which are also commonly referred to as Shockley diodes, are two terminal unidirectional semiconductor switches having two stable states, a high impedance and a low impedance state. As is shown in FIGURE 6, a four layer diode is comprised of a P-type and N-type zones of semiconducting material. The diode is switched from its high impedance state when the voltage across terminals 62 and 63 is of the polarity as shown and exceeds the switching voltage of the diode. When the polarity across the terminals 62 and 63 is opposite to that indicated in FIGURE 6, it will be understood, of course, that the device will not be switched to its low impedance state. The four layer diodes $D_{10}$ and $D_{11}$ are turned off or switched to a high impedance state by allowing the current to the device to fall below the holding current value. Thus, the diodes $D_{10}$ and $D_{11}$ shown in FIGURE 5 are turned off at the end of the half cycle during which they conduct, when the voltage drops to zero at the end of the cycle. The diodes $D_1^2$ and $D_{11}$ will remain in a low impedance state in their respective half cycles so long as the current through the diode is maintained above the holding current value.

Figure 7:
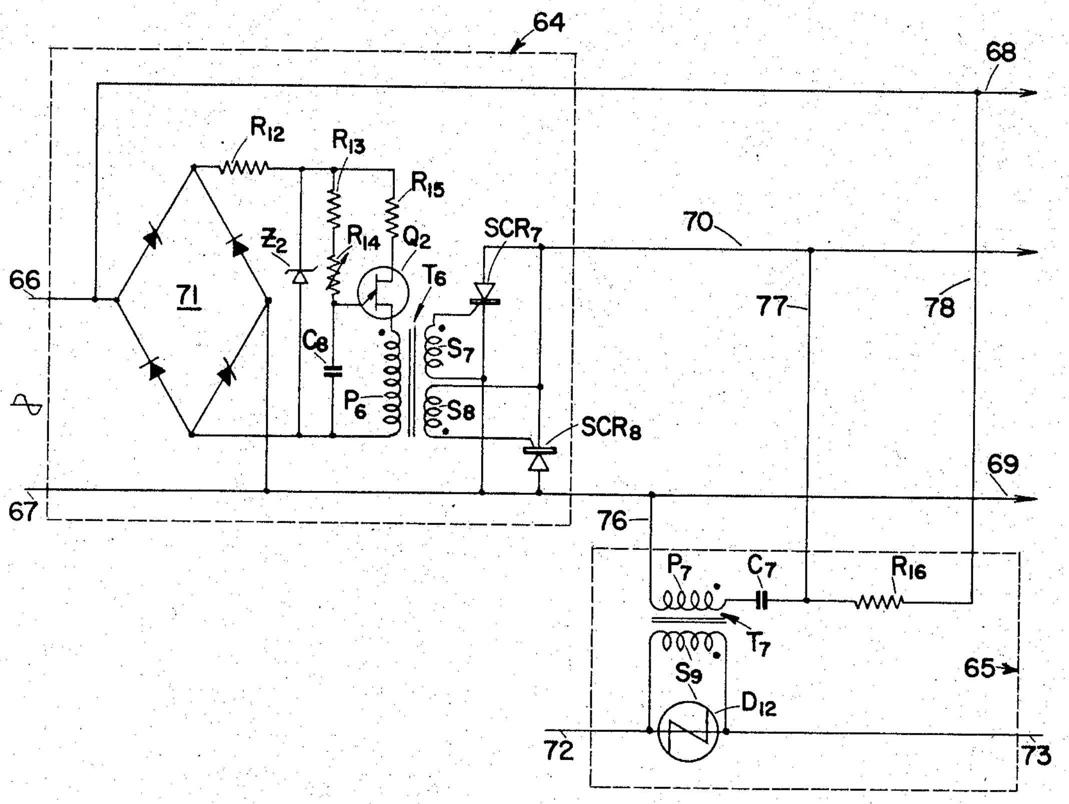
FIGURE 7 is a schematic circuit diagram of another improved firing circuit embodying the invention in which an alternating signal is applied across the auxiliary circuit.

In FIGURE 7 I have illustrated another embodiment of the invention in which a master firing control 64 is operated in conjunction with a plurality of auxiliary circuits, such as the circuit 65, which are energized by an alternating current. It will be noted that the auxiliary circuits in the previously described embodiment were energized by a rectified A.C. signal. Input leads 66 and 67 of the master firing circuit 64 are adapted for connection to an alternating supply such as a 120 volt, 60 cycle source. Thus, an alternating voltage appears across the leads 68 and 69 and across leads 76 and 78 of the auxiliary circuit 65.

Since the switching action of the master firing circuit 64 must be carried out during each positive and negative alternation of the supply voltage, a pair of controlled rectifiers $SCR_7$ and $SCR_8$ are connected in inverse parallel relation across leads 69 and 70. The point in each half cycle at which the controlled rectifiers $SCR_7$ and $SCR_8$ are symmetrically fired is determined by the relaxation oscillator which includes a pulse transformer $T_6$, resistor $R_{12}$, $R_{13}$, $R_{14}$, $R_{15}$, a Zener diode $Z_2$ and a capacitor $C_8$. The relaxation oscillator is energized from the output of a full wave bridge rectifier 71.

The relaxation oscillator functions in the same manner as the oscillator shown in the master firing circuit shown in FIGURE 1. The setting of the variable resistor $R_{14}$ determines the point in each half cycle at which the capacitor $C_8$ is charged to the peak emitter voltage of the unijunction transistor $Q_2$. Until the unijunction transistor $Q_2$ is fired, the controlled rectifier $SCR_7$ and $SCR_8$ are in a blocking state, and lead 70 is in effect disconnected from lead 69 by virtue of the high impedance presented by the rectifiers. When one of the controlled rectifiers $SCR_7$ or $SCR_8$ is switched into conduction, lead 70 is in effect connected in circuit with lead 69 to cause the capacitor $C_7$ of the auxiliary circuit 65 to discharge.

Having reference now in more detail to the auxiliary circuit 65 shown in FIGURE 7, it will be seen that the RC circuit includes the resistor $R_{16}$ and the capacitor $C_7$, and is connected with the primary winding $P_7$ of the transformer $T_7$. A high impedance secondary winding $S_9$ inductively coupled with the primary winding $P_7$ is connected across a five layer diode $D_{12}$. Such an arrangement results in the advantage that the secondary winding $S_9$ does not have to carry the full load current as compared with a serially connected secondary winding but must provide a relatively high impedance.

Lead 72 is adapted for connection to the high potential side of the alternating power source used to energize the load to be controlled and would be generally designated as a black lead. Lead 73 is adapted for connection in circuit with the load so that the average power to the load is controlled by the interval of current conduction between the leads 72 and 73 in each half cycle. For example, where power is supplied to a dimming ballast, such as is shown in FIGURE 3, lead 73 would be connected to the switching lead 40, and lead 72 would be connected in circuit with lead 41 which is adapted for connection to the high potential side of the power supply. Thus, lead 72 would be connected in circuit with the high potential side of the power supply.

Figure 8:
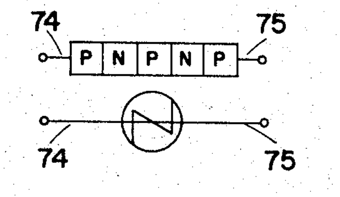
FIGURE 8 illustrates schematically the P–N junction arrangement of the bidirectional five layer diode shown in FIGURE 7.

The five layer diodes, which can be used in the practice of the invention, are, as shown in FIGURE 8, comprised of alternate P-type and N-type layers. As shown, the symbol used to represent the five layer diode consists of two spaced vertical lines joined at one end by a slant line. The five layer diode resembles the four layer diode in its essential characteristics except that it is bidirectional and can be fired during each alternation of the voltage when the switching voltage across its terminals 74 and 75 is exceeded.

The voltage at switching lead 72 is synchronized with the supply voltage across the input leads 66 and 67 of the master firing circuit 64 so that the polarity of the voltage pulse induced across the secondary winding $S_9$ is such that the left end of the winding, as seen in FIGURE 7, is positive with respect to the right end when the voltage at switching lead 72 is positive with respect to lead 73. In the next half cycle when the capacitor $C_7$ is discharged, the polarity of the voltage pulse induced across the secondary winding $S_9$ is opposite to what it was in the preceding half cycle, and the voltage at switching lead 73 is now more positive with respect to the voltage at lead 72. Thus, the five layer diode $D_{12}$ is switched to a low impedance state, since the voltage pulse across the secondary winding $S_9$ adds to the voltage across the diode $D_{12}$ in each half cycle and causes the combined voltage to exceed the switching voltage of the diode $D_{12}$.

During operation, the polarity of the voltage across the capacitor $C_7$ changes with each alternation of the supply voltage. Consequently, when capacitor $C_7$ is discharged in each half cycle by the switching action of the controlled rectifiers $SCR_7$ and $SCR_8$, the polarity of output pulse across the secondary winding $S_9$ will reverse in successive half cycles, and the five layer diode $D_{12}$ will be switched on at a predetermined point in each half cycle.

Although I have only shown one auxiliary circuit 65 connected in circuit with the leads 68, 69 and 70, it will be appreciated that a plurality of additional auxiliary circuits may be operated from the master firing circuit 64.

Figure 9:
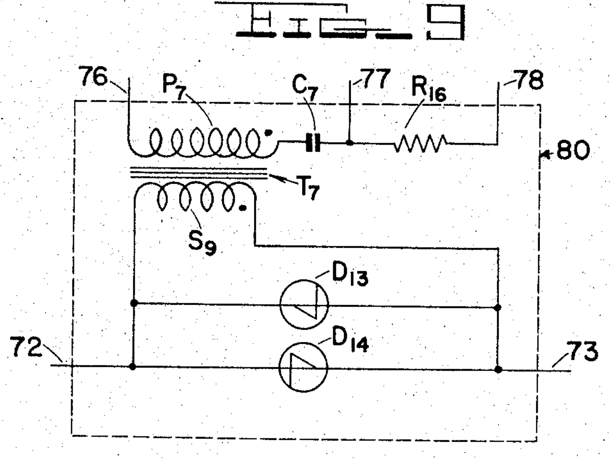
FIGURE 9 illustrates another type of auxiliary circuit that can be used in conjunction with the master firing circuit shown in FIGURE 7.

In FIGURE 9, I have illustrated an auxiliary circuit 80 which may be used in conjunction with the master firing circuit 64 shown in FIGURE 7. The auxiliary circuit 80 is similar to the auxiliary circuit 65 shown in FIGURE 7 except that a pair of four layer diodes $D_{13}$ and $D_{14}$ are connected in inverse parallel relation across a relatively high impedance secondary winding $S_9$ of the transformer $T_7$. Since the auxiliary circuits are essentially similar, I have identified the corresponding parts thereof with the same reference symbols. Thus, leads 76, 77 and 78 are provided for connection in circuit with leads 69, 70 and 68 respectively of the master firing circuit 64. The switching leads 72 and 73 are adapted for connection to a load in the same manner as the corresponding leads of the auxiliary circuit 65, lead 72 being adapted for connection to the high potential side of the load power supply. It will be seen that the four layer diode $D_{13}$ comes into play when the voltage at lead 73 is positive with respect to the voltage at lead 72, and the four layer diode $D_{14}$ comes into play when the voltage at switching lead 72 is more positive than the voltage at lead 73. An important advantage of the circuit arrangement shown in FIGURE 9 is that the load current does not have to pass through the secondary winding $S_9$.

From the foregoing description of the various embodiments of my invention, it will be apparent that many modifications may be made. It will be understood, however, that these embodiments of the invention are intended as exemplifications of the invention and that the invention is not limited thereto. It is to be understood, therefore, that I intend by the appended claims to cover all such modifications that fall within the true scope and spirit of the invention.

What I claim as new and desire to secure by Letters Patent of the United States is:

1. A firing circuit for use in conjunction with a potential source to fire a plurality of solid state control devices, said firing circuit comprising: a master control device, a plurality of slave control devices, each of said control devices having a plurality of semiconducting zones forming more than two P-N junctions, means coupled with said master control device for phase controlling said master device, a plurality of sets of serially connected capacitors and resistors, circuit means for connecting each of said serially connected capacitor and resistor sets across the potential source to supply charging current to the capacitors and connecting each of said capacitors in circuit across said master control device to provide a discharge path for the capacitors through the master control device, and means coupling each of said capacitors with at least one of said plurality of slave control devices for firing said slave control devices when the capacitors are discharged, said master control device when fired causing each of said capacitors to be discharged thereby to cause said plurality of slave control devices to be symmetrically fired.

2. A firing circuit for firing a plurality of solid state control devices from a potential source, said firing circuit comprising: at least one master control device, means coupled with said master control device for phase controlling said master device, a plurality of auxiliary circuits each including a slave control device having a plurality of semiconducting zones forming more than two P–N junctions, each of said auxiliary circuits further including a serially connected capacitor and a resistor connected in circuit across the potential source, to permit charging of the capacitors, circuit means connecting each of said capacitors in circuit across the master control device to provide a discharge path for the capacitors, and means coupling each said capacitor with at least one of the plurality of slave control devices for switching said slave control devices into conduction when the capacitors in the auxiliary circuits are discharged, said master control device when switched into conduction causing the capacitors of the auxiliary circuits to be discharged and cause said plurality of control devices to be symmetrically fired.

3. The firing circuit set forth in claim 2 wherein said slave control devices are four layer diodes.

4. The firing circuit set forth in claim 2 wherein said slave control devices are five layer diodes.

5. A firing circuit for use in conjunction with a source of potential and for simultaneously firing a plurality of solid state controlled rectifiers, said firing circuit comprising: at least one master controlled rectifier, a firing circuit means adapted for connection to said potential source and coupled with said master controlled rectifier for switching said master controlled rectifier into conduction at selected intervals, a plurality of auxiliary firing circuits, each of said auxiliary circuits including at least one slave controlled rectifier, said controlled rectifier having an anode, a cathode and a gate, a serially connected capacitor and resistor, and means coupling said capacitor and reand resistor, and means coupling said capacitor with said slave controlled rectifier for firing said slave controlled rectifier when the capacitor is discharged; and circuit means including leads for connecting each of said serially connected capacitors and resistors with the source of potential to provide a charging path for the capacitors and connecting said capacitors in circuit across said master controlled rectifier to provide a discharge path for the capacitors, said master controlled rectifier when switched into conduction causing said capacitors of said auxiliary firing circuits to be discharged thereby to cause said plurality of slave controlled rectifiers to be fired.

6. The firing circuit as set forth in claim 5 wherein each of said means coupling said capacitor with at least one of said slave controlled rectifiers includes a transformer having a primary connected in series circuit with the said capacitor and a secondary connected in circuit with the gate of said one of said slave controlled rectifiers.

7. A firing circuit for firing a plurality of controlled rectifiers from a cyclically varying potential source, said master firing circuit comprising: a master controlled rectifier, a plurality of auxiliary circuits, each of said auxiliary circuits including at least one slave controlled rectifier, each of said controlled rectifiers having an anode, a cathode and a gate, a relaxation oscillator coupled with said master controlled rectifier for firing said master controlled rectifier, said relaxation oscillator including a unijunction transistor having an emitter, a base-one and a base-two electrode, a variable resistor and a capacitor connected in circuit with the emitter electrode and the potential source, a Zener diode connected across said variable resistor and capacitor, said variable resistor controlling the point in each half cycle when said master controlled rectifier is fired, each of said auxiliary circuits including a capacitor and impedance element joined in series circuit relation and connected across the potential source to permit charging of the capacitor, circuit means connecting said capacitors in circuit across the anode and cathode of said master controlled rectifier to provide a discharge path for the capacitors through said master controlled rectifier, and means coupling each of said capacitors with at least one of said slave controlled rectifiers for applying at the gates thereof a firing signal when said capacitor is discharged, said master controlled rectifier when switched into conjunction causing said capacitors to discharge and simultaneously fire said slave controlled rectifiers.

8. The firing circuit set forth in claim 7 wherein said means coupling said capacitor with at least one of said slave controlled rectifiers includes a transformer having a primary connected in series current with said capacitor and a secondary connected in circuit with the gate of at least one of said slave controlled rectifiers.

9. A firing circuit for symmetrically firing a plurality of solid state control devices from a potential source, each of said solid state control devices being connected with a ballast means for operating a bank of electric discharge lamps at selected levels of illumination, said firing circuit comprising: a master control device, a plurality of slave control devices adapted for connection with the ballast means, each of said control devices having a plurality of semiconducting zones forming more than two P–N junctions and having gates, means coupled with said master control device for firing said master control device, a plurality of sets of serially connected capacitors and impedance elements, circuit means for connecting each set of said serially connected capacitors and impedance elements across the potential source for charging the capacitors and connecting each of said capacitors across said master control device to provide a discharge path for the capacitors, and means coupling each of said capacitors in circuit with one of said slave control devices for applying a firing signal at the gates thereof when said capacitors discharge, said master control device when fired causing each of said capacitors to be discharged thereby to cause said plurality of slave control devices to be symmetrically fired.

10. An auxiliary firing circuit for use in conjunction with a source of potential and a control circuit having at least one master solid state control device, said auxiliary circuit comprising: an RC circuit including a capacitor and an impedance element, a transformer having a primary connected in circuit with said RC circuit and at least one secondary winding inductively coupled with said primary, input means including leads adapted for connecting said RC circuit and said primary winding in circuit with the potential source and the control device so that the capacitor of said RC circuit is charged from the potential source and discharged when the master control device is fired, a multilayer slave solid state control device, said multilayer slave solid state control device being comprised of more than two P–N junctions, and being switchable to a high impedance and a low impedance state, means coupling said multilayer device with the output of said transformer for switching said multilayer device when said capacitor is discharged, and output means coupled with said slave device including switching leads for connection to a load, said slave control device being switched to present a low impedance between said switching leads when said capacitor is discharged.

11. An auxiliary circuit for use in conjunction with a source of potential and a master firing circuit including at least one master control device, said auxiliary circuit comprising a transformer having a primary and at least one secondary winding inductively coupled therewith, a resistor, a capacitor, said resistor and said capacitor being connected in a series circuit relation with a primary winding, input means including leads for connecting said serially connected primary winding, said capacitor and said resistor in circuit with the potential source for charging said capacitor and including a lead connected in circuit with said capacitor and adapted for connection to the master control device to provide a discharge path for the capacitor, said capacitor being discharged when the master control device is switched into conduction, at least one slave multilayer switching device coupled with the output of said transformer, said slave device being comprised of a plurality of P–N junctions and being switched to a low impedance state when said capacitor is discharged, and output means coupled with said slave device and including switching leads connected therewith whereby said slave device presents a low impedance between said leads when switched into conduction.

12. A firing circuit for use in conjunction with a source of potential and for firing a plurality of four layer diodes, said firing circuit comprising: a master control device, means coupled with said master control device for phase controlling said device, a plurality of four layer diodes, each of said four layer diodes having four semiconducting zones and being switchable to a low impedance state when the voltage across the diode exceeds its switching voltage, a plurality of transformers, each of said transformers having a primary and a secondary, a serially connected capacitor and impedance element associated with the primary of each of said transformers, circuit means for connecting the primary of each of said transformers and the serially connected capacitor and resistor associated therewith in circuit with the potential source for charging the capacitor and for placing said capacitor and said primary in circuit across the master control device, to discharge the capacitor, each of said secondaries having a pair of said four layer diodes connected in inverse parallel circuit relation thereacross, and an input means coupled with said pair of four layer diodes and including switching leads connected in circuit therewith, said four layer diodes being switched to present a low impedance between said switching leads when said capacitors are discharged by said master control device.

13. A firing circuit for use in conjunction with a source of alternating potential and for firing a plurality of five layer diodes, said firing circuit comprising: a pair of master solid state control devices connected in inverse parallel relation; a firing circuit means adapted for connection to said source of potential and coupled with said pair of master solid state control devices for switching said devices into conduction at selected intervals, and a plurality of auxiliary circuits, each of said auxiliary circuits including a slave five layer diode, a serially connected capacitor and resistor, and a transformer having a primary and a secondary, the secondary being connected to the slave five layer diode; circuit means for connecting the primary of each of said transformers and the serially connected capacitor and resistor associated therewith in circuit with the potential source for charging the capacitor and for placing said capacitor and said primary in circuit across the master solid state control devices to discharge the capacitor when one of said solid state control devices is switched into conduction, said master control device when switched into conduction causing the capacitors of all of the auxiliary circuits to be discharged and thereby causing said plurality of slave five layer diodes to be symmetrically fired.

References Cited

UNITED STATES PATENTS

| | | | |
|---|---|---|---|
| 3,031,598 | 4/1962 | Bell | 315—201 |
| 3,158,799 | 11/1964 | Kelley et al. | 321—27 |
| 3,249,807 | 5/1966 | Nuckolls | 315—199 |

JOHN W. HUCKERT, *Primary Examiner.*

R. F. POLISSACK, *Assistant Examiner.*

UNITED STATES PATENT OFFICE

CERTIFICATE OF CORRECTION

Patent No. 3,323,014 May 30, 1967

Thomas G. West

It is hereby certified that error appears in the above numbered patent requiring correction and that the said Letters Patent should read as corrected below.

Column 11, lines 14 and 15, strike out "and re- and resistor, and means coupling said capacitor"; line 59, for "conjunction" read -- conduction --.

Signed and sealed this 27th day of August 1968.

(SEAL)
Attest:

Edward M. Fletcher, Jr.
Attesting Officer

EDWARD J. BRENNER
Commissioner of Patents